(12) United States Patent
Hsu et al.

(10) Patent No.: US 7,544,305 B2
(45) Date of Patent: *Jun. 9, 2009

(54) CHEMICAL MECHANICAL POLISHING PROCESS FOR FORMING SHALLOW TRENCH ISOLATION STRUCTURE

(75) Inventors: Chia-Jung Hsu, Dacheng Township, Changhua County (TW); Art Yu, Fongshan (TW); Hsiao-Ling Lu, Jhudong Township, Hsinchu County (TW); Teng-Chun Tsai, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/863,665

(22) Filed: Sep. 28, 2007

(65) Prior Publication Data

US 2008/0029478 A1 Feb. 7, 2008

Related U.S. Application Data

(63) Continuation of application No. 10/752,362, filed on Jan. 5, 2004, now Pat. No. 7,294,575.

(51) Int. Cl.
*B44C 1/22* (2006.01)

(52) U.S. Cl. ............................. 216/38; 216/52; 216/88; 216/89

(58) Field of Classification Search .................. 216/38
See application file for complete search history.

(56) References Cited

U.S. PATENT DOCUMENTS

| 5,759,917 | A  | * | 6/1998  | Grover et al. | ............... | 438/690 |
| 6,638,866 | B1 | * | 10/2003 | Cheng et al.  | ............... | 438/692 |
| 2003/0153246 | A1 | * | 8/2003 | Desai et al.  | .................... | 451/8 |
| 2003/0176151 | A1 | * | 9/2003 | Tam et al.    | .................... | 451/41 |

* cited by examiner

*Primary Examiner*—Keith D Hendricks
*Assistant Examiner*—Patricia A George
(74) *Attorney, Agent, or Firm*—J.C. Patents

(57) ABSTRACT

A shallow trench isolation (STI) multistage chemical mechanical polishing (CMP) method for forming a shallow trench isolation structure is provided. The substrate comprising a dense region and an isolation region, a silicon nitride layer formed over the substrate, a plurality of trenches formed in the silicon nitride layer and the substrate, an oxide layer formed over the substrate, filling the trenches, wherein a width of the trenches in the dense region is smaller than that in the isolation region. A first polishing step is performed to remove a portion of the silicon oxide layer until a thickness of the remaining portion of the oxide layer reaches a predetermined thickness. A second polishing step is performed to remove a portion of the remaining portion of the silicon oxide layer until the silicon nitride layer is exposed.

5 Claims, 4 Drawing Sheets

CHEMICAL MECHANICAL POLISHING PROCESS FOR FORMING SHALLOW TRENCH ISOLATION STRUCTURE

CROSS-REFERENCE TO RELATED APPLICATION

This is a continuation application of patent application Ser. No. 10/752,362; filed on Jan. 5, 2004, which is now U.S. Pat. No. 7,294,575. The entirety of the above-mentioned patent application is hereby incorporated by reference herein and made a part of this specification.

BACKGROUND OF THE INVENTION

1. Field of the Invention

The present invention relates in general to a chemical mechanical polishing (CMP) process. More particularly, the present invention relates to a multistage chemical mechanical polishing process for forming shallow trench isolation structure capable of reducing the cost, simplifying the manufacturing process and increasing the throughput thereof.

2. Related Art of the Invention

The conventional localized oxidation isolation (LOCOS) structure is being gradually replaced by the shallow trench isolation (STI) structure because during the localized oxidation isolation (LOCOS) process, a bird's beak effect is generated rendering the surface of the products non-uniform. In general, it is well recognized in the art that for a semiconductor process having a line width less than 0.25 μcm, the shallow trench isolation (STI) is preferably used because STI not only eliminates the bird's beak effect but also occupy smaller space compared LOCOS. Accordingly, a higher integration of the circuits can be achieved by utilizing STI structure.

FIG. 1A to FIG. 1D are cross-sectional views illustrating a conventional process of forming a shallow trench isolation (STI) structure. First, referring to FIG. 1A, a substrate 102 is provided, and a pad oxide layer 104 and a silicon nitride layer 106 are sequentially formed on the substrate 102. Next, the pad oxide layer 104 and the silicon nitride layer 106 are patterned by performing a lithography and etching processes to form a plurality of trenches in the silicon nitride layer 106, the pad oxide layer and the substrate 102 as shown in FIG. 1B. As shown in FIG. 1B, the pitch, line width and density of the trenches in the dense area 112 are different from that of the isolation area 114. Next, as shown in FIG. 1C, an oxide liner 122 is formed covering the side wall and the bottom of the trenches in order to repair the damage caused by the etching process. The method of forming the oxide liner 122 includes, for example, a thermal oxidation. Next, as shown in FIG. 1D, an oxide layer 132 is formed over the resulting structure filling the trenches. The method of forming the oxide layer 132 includes, for example, a chemical vapor deposition (CVD) method or a high density plasma (HDP) chemical vapor deposition (CVD) method.

With the rapid advancement of the semiconductor manufacturing process, the line width is gradually reduced from 0.18 μm, 0.13 μm to 0.10 μm or less, for example, 90 nm or sub-90 nm. When the line width is shrunk to such a level, in general, the high density plasma chemical vapor deposition (HDP-CVD) method is still useful as a gap-fill process for forming the shallow trench isolation (STI) structure. The fill material used in the HDP-CVD method is silicon dioxide. However, when the line width is shrunk, the aspect ratio (AR) of depth to width of the trench will correspondingly increase making that gap filling process difficult. Consequently, voids are easily formed within the trench, and thereby rendering the gap-fill process very challenging and complex. Thus, in the gap-fill process of the shallow trench isolation (STI) structure of 90 nm and sub-90 nm level, a deposition-etching-deposition (DED) gap-fill process by using a multi-step gap-fill process is developed, in order to achieve void-free gap-fill of a high aspect ratio (AR) trench to form void-free shallow trench isolation (STI) structure. The etching process can be a dry etch or a wet etch process.

However, the disadvantage of the multi-step gap-fill process described above is that the thickness of the overburden over the shallow trench isolation structure is increased drastically, and the difference of the overburden thickness in the isolation area and the dense area (the iso/dense thickness uniformity) is also increased. For example, in the 0.13 μm process, a single deposition step is used for forming the oxide layer 132, the resulting overburden thickness is about 150 nm, and the iso/dense thickness uniformity is in a range of about 20 nm. However, in the 90 nm process, when the above-described deposition-etching-deposition (DED) gap-fill process is performed, the resulting overburden thickness is about 400 nm, and the iso/dense thickness uniformity is in a range of about 300 nm. Therefore, when resulting structure is planarized by performing a chemical mechanical polishing (CMP) process, the overpolishing of the oxide layer over the isolation area 114 easily occurs.

The chemical mechanical polishing (CMP) process, in general, has the advantages of low cost, high removal rate and high uniformity efficiency. Taking a silica based shallow trench isolation structure, the removal rate (RR) is more than 250 nm/min. However, the disadvantage is that the selectivity of oxide to nitride is low and therefore the insufficient polishing or over-polishing of the oxide layer occurs, and thus requires an additional external process using a reserve mask (RM) to resolve this problem.

In order to overcome the disadvantages of the CMP process described above, a chemical mechanical polishing (CMP) method using a high selectivity slurry (HSS) or a fixed abrasive (FA) pad and without requiring the use of reserve mask is developed recently. In general, the major polishing components in the HSS slurry include cerium oxide ($CeO_2$). The major polishing particles of the fixed abrasive (FA) polishing method may also include cerium oxide ($CeO_2$). Although a higher oxide to nitride selectivity is obtained in the improved chemical mechanical polishing (CMP) method described above, however, this improved CMP method still has certain disadvantages, such as a higher cost, a low removal rate and non-uniformity. For example, it is preferable that the difference of thickness uniformity of the polished layer is in a range of about 300 nm. Moreover, for example, the removal rate of the high selectivity slurry is generally in a range of about 60 nm/min, the removal rate of the fixed abrasive (FA) is about 150 nm/min, and both of the removal rates are less than that of the conventional CMP method. Therefore, in the post shallow trench isolation chemical mechanical polishing (post STI-CMP) process, if only the high selectivity slurry or the fixed abrasive (FA) pad is used, the performance of the planarization is prolonged compared to the conventional CMP method and therefore not acceptable. Moreover, the residues of the oxide layer are easily generated. Therefore, a CMP polishing method that can reduce the cost, simply the process, and increase the throughput is highly desirable.

SUMMARY OF THE INVENTION

Accordingly, the present invention provides a chemical mechanical polishing (CMP) process for forming a shallow trench isolation structure. The CMP process of the present invention is capable of reducing the cost, simplifying the process and increasing the throughput thereof. Therefore, the disadvantage of the conventional chemical mechanical polishing process can be resolved.

In order to achieve the above objects and other advantages of the present invention, a multistage chemical mechanical polishing method for forming a shallow trench isolation structure is provided. The CMP method of the present invention comprises: providing a structure, the structure comprises a substrate, a silicon nitride layer formed on the substrate, a plurality of trenches formed in the silicon layer and the substrate, and an oxide layer formed over the trenches filling the trenches. Next, a first polishing step having a first removal rate corresponding to a first selectivity of oxide to nitride is performed the structure to remove a portion of the oxide layer, wherein the first polishing step is stopped when a thickness of the remaining portion of the oxide layer reaches a predetermined thickness. Next, a second polishing step having a second removal rate corresponding to a second selectivity of oxide to nitride is performed to remove a portion of the remaining portion of the oxide layer until the patterned silicon nitride layer is exposed. It is preferred that the second selectivity of oxide to nitride is larger than the first selectivity of oxide to nitride.

According to an aspect of the present invention, the first removal rate is higher than the second removal rate.

Preferably, the predetermined thickness range is in a range of about 10 nm to about 150 nm.

According to another aspect the second polishing step includes using high selectivity slurry (HSS) or a fixed abrasive (FA) pad.

Accordingly, the multistage chemical mechanical polishing (CMP) process of the present invention, the multistage chemical mechanical polishing (CMP) process comprises at least two polishing steps and includes the advantages of high removal rate and high selectivity. Accordingly, the disadvantages of the conventional chemical mechanical polishing (CMP) method, for example, insufficient polishing and over polishing due to the low selectivity can be effectively reduced, and the use of addition reserve mask (RM) can be effectively avoided. In addition, the disadvantages of generation of residues due to low removal rate corresponding to the high selectivity can also be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Hereinafter, some embodiments will be illustrated to describe the multistage chemical mechanical polishing (CMP) process of the present invention. In the following description, a multistage chemical mechanical polishing (CMP) process for a shallow trench isolation structure is provided as an example for of the present invention, but the scope of the multistage chemical mechanical polishing (CMP) process of the present invention is not limited to the embodiment. The multistage chemical mechanical polishing (CMP) process of the present invention can also be provided to another process flow including a CMP process. Therefore, the thickness of the layer, the materials and the parameters are all for example and may not be used to limit the scope of the present invention.

Figure 1A:
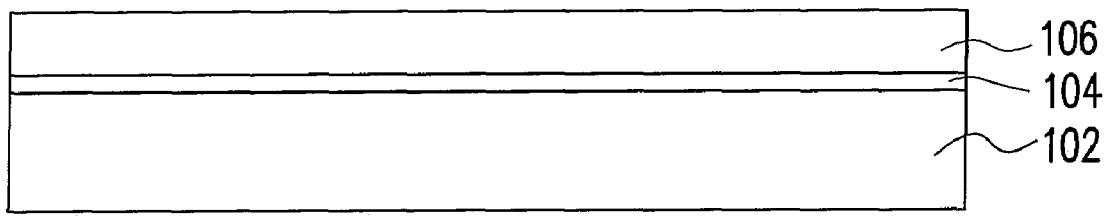
FIG. 1A to FIG. 1D are cross-sectional views illustrating a conventional process of forming a shallow trench isolation (STI) structure.
Figure 1B:
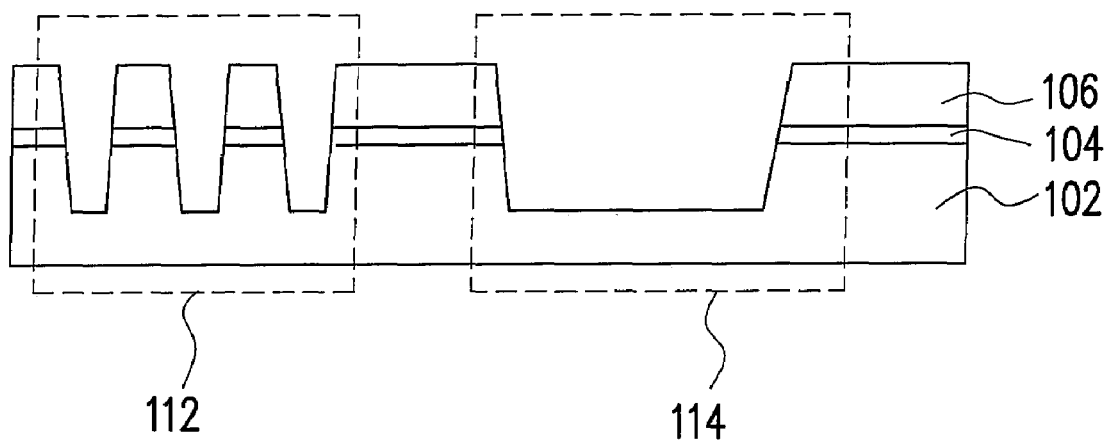
Figure 1C:
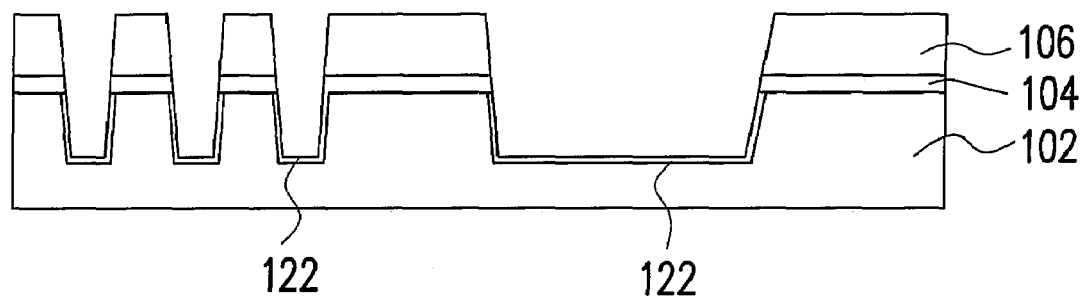
Figure 1D:
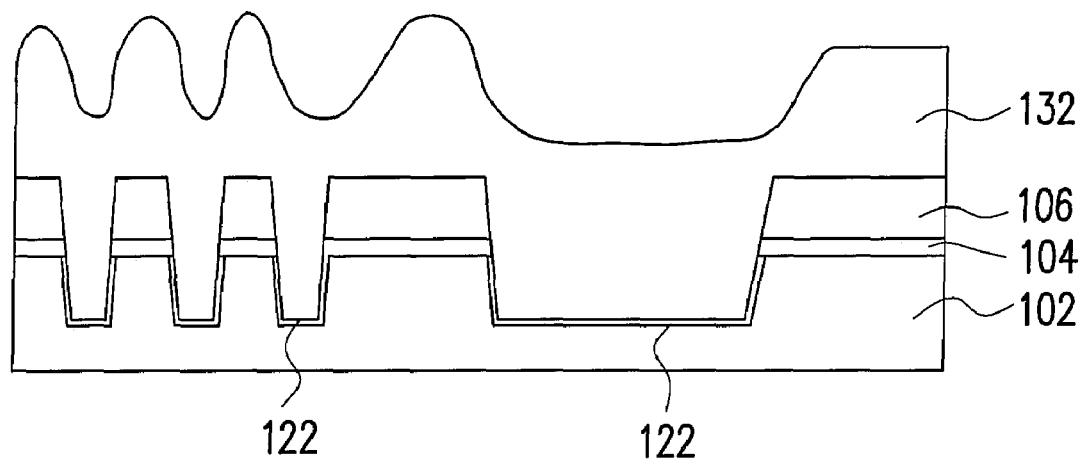
Figure 2A:
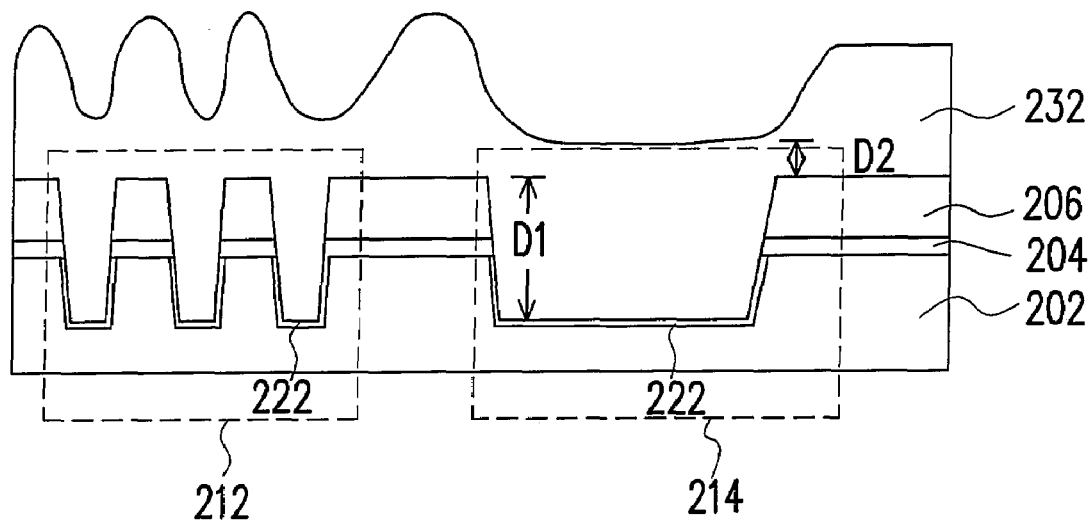
FIG. 2A to FIG. 2D are cross-sectional views illustrating a process forming a shallow trench isolation structure using a multistage chemical mechanical polishing (CMP) process according to a preferred embodiment of the present invention.
Figure 2B:
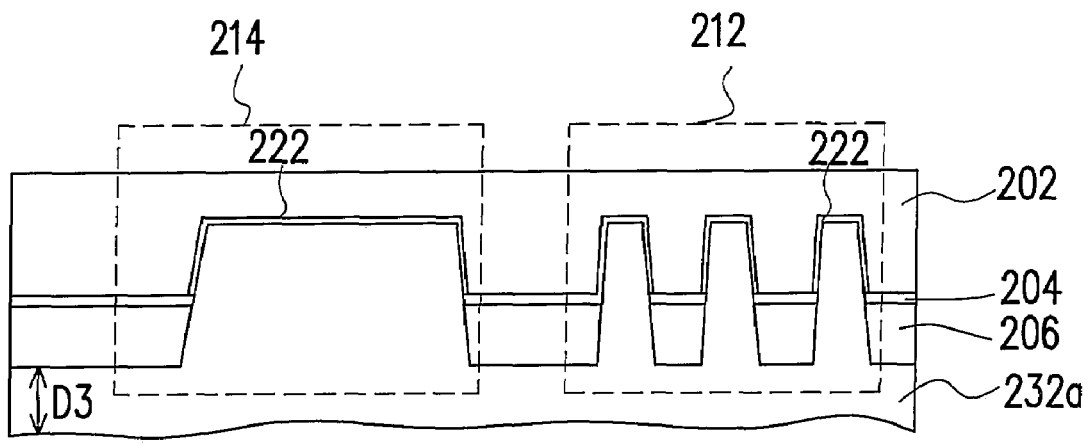
Figure 2C:
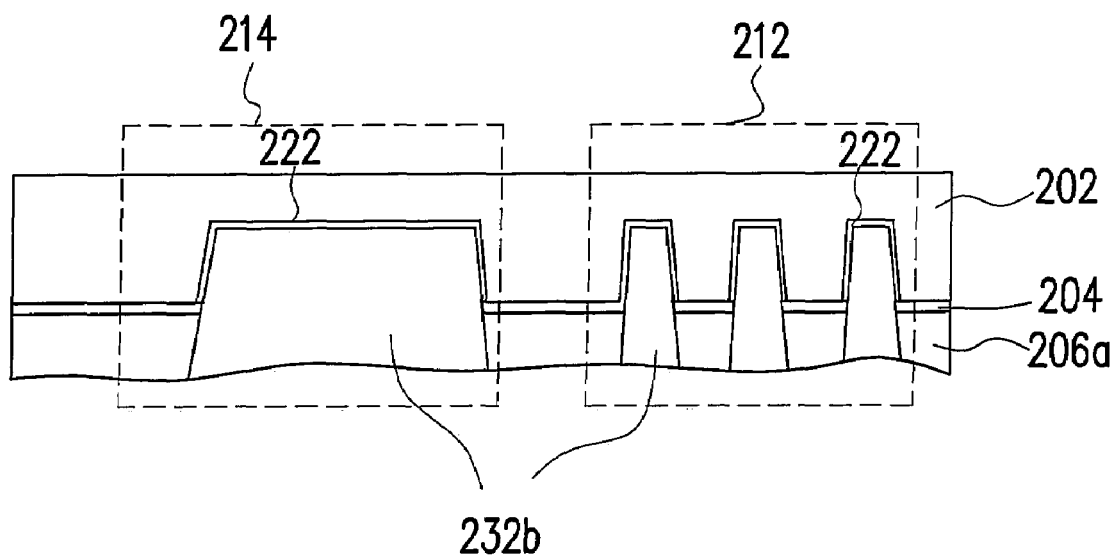

FIG. 2A to FIG. 2D are cross-sectional views illustrating a process of forming a shallow trench isolation structure using a multistage chemical mechanical polishing (CMP) process according to a preferred embodiment of the present invention. Referring to FIG. 2A to FIG. 2C, substantially, the structure in FIG. 2A similar to the structure shown in FIG. 1D and can be formed by using the similar process for forming the structure of FIG. 1D. As shown in FIG. 2A, the structure comprising a substrate 202 having a dense area 212 and an isolation area 214, a pad oxide layer 204 and a silicon nitride layer 206 formed on the substrate, a plurality of trenches formed in the silicon nitride layer 206, the pad oxide layer 204 and the substrate 202, an oxide liner 222 formed on the side wall and the bottom of all of the trenches, and an oxide layer 232 formed over the trenches filling the trenches.

According to an embodiment of the present invention, in order to fully cover the oxide liner 222, the pad oxide layer 204 and the silicon nitride layer 206 over the trenches by the oxide layer 232, the thickness of the oxide layer 232 should be larger than the depth D1 of the shallow trench structure. Therefore, the resulting structure will have an overburden having a thickness D2. When the line width is shrunk, the thickness of the overburden of the oxide layer over the shallow trench isolation structure also increases, and the iso/dense thickness uniformity correspondingly decreases.

A chemical mechanical polishing (CMP) process is performed over the structure of FIG. 2A to remove a portion of the oxide layer 232 until the thickness of the remaining portion of the oxide layer 232a reaches a predetermined thickness in order to substantially smoothen the rough surface of the oxide layer 232. Finally, another CMP process is performed over the resulting structure to remove a portion of the remaining portion of the oxide layer 232a until the silicon nitride layer 206 is exposed. An etching process is performed to remove a portion of the remaining portion of the oxide layer 232b, the silicon nitride layer 206 and the pad oxide layer 204.

According to an embodiment of the present invention, the advantages of the conventional chemical mechanical polishing (CMP) method, such as high removal rate and high selectivity of oxide to nitride are combined. In order to achieve the above advantages, the present invention provides a multistage chemical mechanical polishing (CMP) process comprising multiple polishing steps. The multistage CMP method of the present invention begins with subjecting the structure of FIG. 2A to a first polishing step. The structure as shown in FIG. 2B shows the result of the first polishing step. Wherein during the first polishing step, the structure of FIG. 2A is held upside down on the polish pad. Preferably, the first polishing step is a conventional chemical mechanical polishing (CMP) method having a higher removal rate. Accordingly, with a higher removal rate, for example, larger than 250 nm/min, the rough surface of the oxide layer 232 can be rapidly removed by removing a portion of the oxide layer 232. The first polishing step is stopped before the exposure of the silicon nitride layer 206 and when a thickness of the remaining portion of the oxide layer 232a reaches a predetermined thickness. At this stage, the thickness uniformity of the remaining portion of the oxide layer 232 is substantially increased. Further, the thickness of the remaining portion of the oxide layer 232a can be optimized to a predetermined thickness. The predetermined thickness of the remaining portion of the oxide layer 232a can be set according to the line width. For example, in a 0.13 µm process, when the oxide layer 232 is formed by a single deposition process, the overburden thickness D2 is about 150 nm, the iso/dense thickness uniformity is in a range of about 20 nm. However, in a 90 nm process, if a multistage gap-fill process, for example, a deposition etching-deposition (DED) process is used, the overburden thickness D2 is in a range of about 400 nm, and the iso/dense thickness uniformity is in a range of about 300 nm. Therefore, preferably the predetermined thickness D3 of the remaining portion of the oxide layer 232a can be set, for example, but not limited to, a range of about 10 nm to about 150 nm. Accordingly, in the first polishing step described above, the predetermined thickness and the removal rate (RR) are set according to the line width of the process. In the first polishing step, the limitation of the selectivity of oxide to nitride that depends on the selection of the slurry or the polish pad does not interfere with the performance thereof.

Next, a second polishing step is performed to polish the surface of the remaining portion of the oxide layer 232a until a surface of the silicon nitride layer 206 is exposed. In other words, the silicon nitride layer 206 is used as a polish stop layer.

Since the rough surface of the oxide layer 232 is substantially smoothened by removing a substantial portion of the oxide layer 232 at a faster rate during the first polishing step until the thickness of the remaining portion of the oxide layer 232a is reaches a prescribed thickness range, and then the remaining portion of the oxide layer 232a is further polished at a comparatively slower rate using the silicon nitride layer as a stop layer, and therefore, the polished surface of the silicon nitride layer 206a and the polished surface of the remaining portion of the oxide layer 232b obtained after the second polishing step will substantially have a smooth topography or a highly planarized surface.

The second polishing step includes, for example, but not limited to, using either a high selectivity slurry (HSS) or a fixed abrasive (FA) pad. The major components of the slurry, or the major polishing particles of the fixed abrasive (FA) pad includes, for example, but not limited to, a cerium oxide ($CeO_2$). Accordingly, the removal rate of the second polishing step and the degree of selectivity of the polishing slurry or the fixed abrasive pad of oxide layer to nitride layer is dependent on the selection of the polishing slurry or the fixed abrasive pad. It is preferred that the selectivity of the oxide layer to nitride layer of the second polishing step is higher than that of the first polishing step. It is further preferred that the removal rate of the first polishing step is higher than the removal rate of the second polishing step. For example, the removal rate of the high selectivity slurry is generally in a range of about 60 nm/min, and the removal rate of a fixed abrasive (FA) is generally in a range of about 150 nm/min.

Figure 2D:
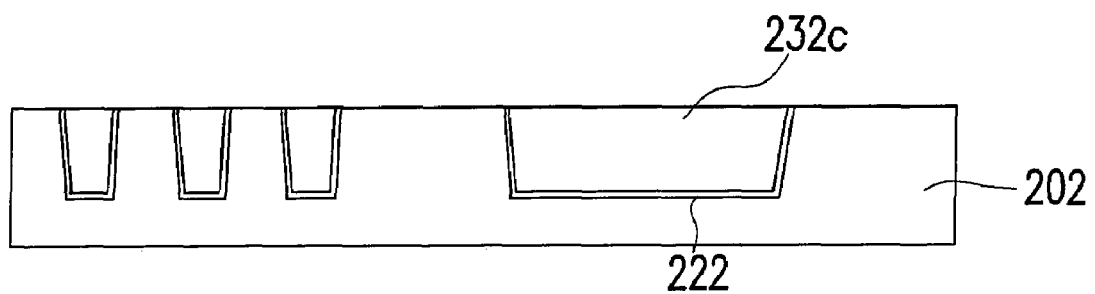

Finally, the remaining portion of the silicon nitride layer 206a, a portion of the oxide layer 232b and the pad oxide layer 204 are removed by performing a conventional etching process. The shallow trench isolation (STI) structure using the multistage CMP process of the present invention is shown in FIG. 2D, wherein a portion of the remaining portion of the oxide layer 232c is left behind in the shallow trench isolation structure 212 and 214.

While the best mode of the present invention is illustrated by describing process of forming the above STI structure using the multistage CMP, however it should be understood by those skilled in the art that the present invention is also applicable to any semiconductor structures having different line width, pitch width and the like, to achieve efficient polishing and substantially smooth topography. Accordingly, it is to be noted that the method of forming the line structure using the multistage CMP method of the present invention will also have all the advantages and features of the process of forming the STI structure formed using multistage CMP method of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multistage chemical mechanical polishing (CMP) method for planarizing a structure, the structure comprising a substrate having a dense region and an isolation region, a silicon nitride layer formed over the substrate, a plurality of trenches formed in the silicon nitride layer and the substrate, an oxide layer formed over the substrate, filling the trenches, wherein a width of the trenches in the dense region is smaller than that in the isolation region, the multistage CMP method comprising:

performing a first polishing step having a first removal rate on the oxide layer with a non-FA pad until a thickness of a remaining portion of the oxide layer reaches a prescribed thickness that is at least 10 nm; and performing a second polishing step having a second removal rate on the remaining portion of the oxide layer with a high selectivity slurry (HSS) comprising $CeO_2$ until the silicon nitride layer is exposed, wherein the first removal rate is higher than the second removal rate and the high selectivity slurry provides a polishing selectivity of the remaining portion of the oxide layer being higher than that of the silicon nitride layer.

2. The multistage CMP method of claim 1, wherein the prescribed thickness is in a range of about 10 nm to about 150 nm.

3. The multistage CMP method of claim 1, wherein the second polishing step comprises using a fixed abrasive (FA) pad.

4. The multistage CMP method of claim 1, wherein the second polishing step comprises using a non-FA pad.

5. The multistage CMP method of claim 1, wherein the first removal rate corresponding to a first selectivity of oxide layer to nitride layer and the second removal rate corresponding to a second selectivity of oxide layer to nitride layer, and then the first selectivity of the oxide layer to nitride layer of the first polishing step is lower than the second selectivity of the oxide layer to nitride layer of the second polishing step.

* * * * *